United States Patent [19]

Tanaka et al.

[11] Patent Number: 5,756,364
[45] Date of Patent: May 26, 1998

[54] LASER PROCESSING METHOD OF SEMICONDUCTOR DEVICE USING A CATALYST

[75] Inventors: Koichiro Tanaka; Naoaki Yamaguchi, both of Kanagawa, Japan

[73] Assignee: Semiconductor Energy Laboratory Co., Ltd., Kanagawa-ken, Japan

[21] Appl. No.: 562,274

[22] Filed: Nov. 22, 1995

[30] Foreign Application Priority Data

Nov. 29, 1994 [JP] Japan ................. 6-319224

[51] Int. Cl.⁶ ................................. H01L 21/268
[52] U.S. Cl. ............ 437/21; 437/174; 437/907; 437/967; 117/8; 117/904; 148/DIG. 90; 148/DIG. 93
[58] Field of Search ................ 437/21, 40 TFT, 437/41 TFT, 46, 173, 174, 233, 967, 907, 908; 148/DIG. 90, DIG. 91, DIG. 92, DIG. 93; 117/7, 8, 10, 904

[56] References Cited

U.S. PATENT DOCUMENTS

| | | | |
|---|---|---|---|
| 5,147,826 | 9/1992 | Liu et al. | 437/233 |
| 5,247,375 | 9/1993 | Mochizuki et al. | 359/54 |
| 5,275,851 | 1/1994 | Fonash et al. | 437/233 |
| 5,365,875 | 11/1994 | Asai et al. | 117/7 |
| 5,372,836 | 12/1994 | Imahashi et al. | 437/173 |
| 5,413,958 | 5/1995 | Imahashi et al. | 148/DIG. 90 |
| 5,432,122 | 7/1995 | Chae | 437/173 |
| 5,541,119 | 7/1996 | Kodama | 437/24 |
| 5,543,352 | 8/1996 | Ohtani et al. | 437/173 |
| 5,569,610 | 10/1996 | Zhang et al. | 437/174 |

FOREIGN PATENT DOCUMENTS

6-104432   4/1994   Japan.

OTHER PUBLICATIONS

G. Liu et al., "Polycrystalline silicon thin film transistors on Corning 7059 glass substrates using short time, low-temperature processing," Appl. Phys. Lett. 62(20), May 17, 1993, pp. 2554–2556.

G. Liu et al., "Selective area crystallization of amorphous silicon films by low-temperature rapid thermal annealing," Appl. Phys. Lett. 55(7), Aug. 14, 1989, pp. 660–662.

Primary Examiner—Charles L. Bowers, Jr.
Assistant Examiner—Leon Radomsky
Attorney, Agent, or Firm—Sixbey, Friedman, Leedom & Ferguson; Gerald J. Ferguson; Jeffrey L. Costellia

[57] ABSTRACT

It is intended to provide a technique of separately forming thin-film transistors disposed in a peripheral circuit area and those disposed in a pixel area in accordance with characteristics required therefor in a manufacturing process of semiconductor devices to constitute a liquid crystal display device. In an annealing step by laser light illumination, laser light is selectively applied to a semiconductor thin-film by partially masking it. For example, to illuminate the peripheral circuit area and the pixel area with laser light under different conditions in manufacture of an active matrix liquid crystal display device, laser light is applied at necessary illumination energy densities by using a mask. In this manner, a crystalline silicon film having a necessary degree of crystallinity in a selective manner can be obtained.

6 Claims, 8 Drawing Sheets

Peripheral circuit region

Pixel region

Mask A

Mask B

LASER PROCESSING METHOD OF SEMICONDUCTOR DEVICE USING A CATALYST

BACKGROUND OF THE INVENTION

1. Field of the Invention

The present invention relates to a semiconductor device laser processing method used in such steps as crystallization, annealing, etc. of a semiconductor material. In particular, the present invention relates to a semiconductor device laser processing method used in a manufacturing method of a liquid crystal display device that uses thin-film transistors.

2. Description of the Related Art

In active matrix liquid crystal display devices, there is known a configuration in which a pixel area for displaying a video image and peripheral circuits for driving pixels are integrated on a single transparent substrate. In general, a glass substrate is used for a liquid crystal display.

In the pixel area, a large number of pixels are arranged in a matrix form and thin-film transistors are connected to the respective pixels. Constituted of thin-film transistors, the peripheral circuits control values of currents to flow through the thin-film transistors connected to the respective pixels.

In the pixel area, each pixel has a role of holding information that is sent from the peripheral driving circuits, and cannot attain that role unless the thin-film transistor connected to the pixel has a sufficiently small off-current. Further, if the off-current of the thin-film transistor largely varies from one pixel to another, even when receiving the same information from the peripheral driving circuits, the pixels display it differently. On the other hand, in the peripheral circuits, the thin-film transistor is required to have a large mobility. With a larger mobility, the circuit configuration can be made simpler and the display device is allowed to operate faster.

As described above, different characteristics are required for thin-film transistors in the peripheral circuits and those in the pixel area, even if they are formed on the same substrate. Thin-film transistors in the pixel area are not required to have a large mobility, but are required to have small off-currents that are uniform in the pixel area. Conversely, as for thin-film transistors in the peripheral circuits, the mobility has priority over the off-current characteristic; that is, they are required to have a large mobility.

In recent years, mainly for the following reason, extensive studies have been made of the temperature reduction in semiconductor device manufacturing processes. In liquid crystal electro-optical devices, the display portion needs to transmit light, and therefore needs to use a glass substrate, which is inexpensive and highly workable. However, glass substrates cannot withstand a high-temperature (1,000° C. or higher) heat treatment. Therefore, the conventional IC manufacturing technology using a silicon wafer cannot be applied directly to liquid crystal electro-optical devices.

The techniques in thin-film transistor manufacturing processes which should attain temperature reduction are techniques for improving the thin-film transistor characteristics.

(1) Crystallizing amorphous components included in a semiconductor material or an amorphous semiconductor material itself.

(2) Recovering the crystallinity of a semiconductor material that was originally crystalline but has been lowered in crystallinity by ion implantation.

(3) Improving the crystallinity of a semiconductor material that is insufficient in crystallinity.

Conventionally, thermal annealing is employed for the above purposes. That is, where silicon is used as a semiconductor material, crystallization of an amorphous material, recovering of crystallinity, improvement of crystallinity, and the like are performed by annealing a subject material at 600° to 1,100° C. for 0.1 to 48 hours.

In general, as the thermal annealing is performed at a higher temperature, the processing time can be made shorter and the crystallization effects become remarkable. However, at a temperature lower than 500° C., the thermal annealing has almost no effect. Therefore, from the viewpoint of the temperature reduction of a process, it is now necessary to replace a thermal annealing step with a step that is based on another technique.

The annealing technique of laser light illumination is now attracting much attention as a technique for replacing the thermal annealing. This is because the laser annealing can apply, in the form of laser light, as high energy as in the case of the thermal annealing to a restricted portion which requires annealing; that is, it is not necessary to expose the entire substrate to a high-temperature atmosphere.

Generally two methods of laser light illumination have been proposed. In a first method, a spot-like beam is applied to a semiconductor material by using a CW laser such as an argon ion laser. When a spot-like beam is applied to a semiconductor material, due to a difference in the energy profile of the beam and movement of the beam, the semiconductor material is melted and then gradually solidified, i.e., crystallized.

In a second method, a pulsed oscillation laser such as an excimer laser is used. A pulse laser light of a high energy density is applied to a semiconductor material, whereupon the semiconductor material is melted instantaneously and then solidified, i.e., crystallized.

SUMMARY OF THE INVENTION

However, it is very difficult for only the laser annealing to produce a crystalline silicon film having such a large mobility as is required for a liquid crystal display device. Therefore, it has conventionally been proposed to form a crystalline silicon film by using both of the thermal annealing and laser annealing.

First a silicon film is crystallized by heating it at about 550° C. for several hours (thermal annealing), and then the crystallinity of a resulting crystallized silicon film is improved by illuminating it with laser light. Thin-film transistors produced by using a crystalline silicon film obtained by this method have small off-currents of about $10^{-12}$ A with a small variation (in the same order), as well as a mobility (about 20 cm$^2$/Vs) as required for thin-film transistors in the pixel area. Therefore, the thin-film transistors thus produced are suitable for use in the pixel area. However, it is difficult for this annealing technique to realize a mobility larger than 100 cm$^2$/Vs, which is required for thin-film transistors in the peripheral circuits.

The present inventors have already proposed a technique of producing a crystalline silicon film having a high mobility in which an amorphous silicon film is crystallized by using a metal element for accelerating crystallization. Various metal elements can be used as the metal element for accelerating crystallization because they are merely required to serve as nuclei when amorphous silicon is crystallized. Our experiments have revealed that the addition of Ni produces the best crystallinity.

One method of adding Ni to an amorphous silicon film is to apply a nickel acetate salt solution to its surface. After the introduction of Ni into the amorphous silicon film, it is crystallized by holding it in an atmosphere of 550° C. for about 4 hours.

The crystallinity of a crystallized silicon film (crystalline silicon film) is improved by illuminating it with linear laser light. The laser light illumination is performed such that weaker pulse laser light is preliminarily applied before application of stronger pulse laser light. During the laser light illumination, a glass substrate is kept at several hundred degrees centigrade (100° to 600° C.).

Thin-film transistors produced by using a crystalline silicon film formed by the above method have a large mobility of more than 100 cm²/Vs, and therefore are suitable for use in the peripheral circuits. On the other hand, since such thin-film transistors have large off-currents that greatly vary from one transistor to another (specifically, by 2 to 5 orders), they are not suitable for used in the pixel area. That is, the above laser processing method cannot produce thin-film transistors suitable for the pixel area and those suitable for the peripheral circuits on the same substrate.

An object of the present invention is to provide, by solving the above problems, a semiconductor device laser processing method which can separately produce on the same substrate semiconductor devices that are required to have different characteristics. More specifically, it is intended to provide a technique of separately producing thin-film transistors disposed in the matrix area and those disposed in the peripheral circuit area.

As described above, an off-current variation among pixels of thin-film transistors disposed in the pixel area is fatal to operation of a liquid crystal display. However, it has been found that in thin-film transistors disposed in the peripheral circuits, a variation of off-currents does not affect operation of a liquid crystal display. A specific example of the peripheral circuits is a shift register circuit.

On the other hand, it has also been found that while thin-film transistors disposed in the peripheral circuits are required to have a large mobility (more than 100 cm²/Vs), thin-film transistors disposed in the pixel area may have a small mobility (about 20 cm²/Vs).

The above discussions lead to a conclusion that in a configuration shown in FIG. 4 a crystalline silicon film is formed with Ni added to only the peripheral circuit area, thereby increasing the crystallinity of the active layers of thin-film transistors disposed in the peripheral circuit area. In this case, thin-film transistors disposed in the peripheral circuit area can be given a large mobility while their off-current characteristic is sacrificed. On the other hand, thin-film transistors disposed in the pixel area can be given a small off-current while their mobility is sacrificed. This utilizes a phenomenon that by worsening the crystallinity of a semiconductor layer that constitutes an active layer (the crystallinity is not improved to a large extent when Ni is not introduced), the off-current can be reduced though the mobility is lowered.

However, the above method causes a large difference in film quality between the peripheral circuit area and the pixel area. Therefore, the crystallization method, specifically the laser light illumination method needs to be adapted properly, because the optimum energy and illumination method of the laser light illumination vary depending on the quality of a semiconductor film and the state of a film formed thereon (a natural oxide film or a mask deposited in the pixel area when Ni is added. Further, the step should be modified properly to accommodate partial addition of Ni.

In view of the above, the present invention is characterized in that in a manufacturing process of semiconductor devices integrated on a single substrate, laser light is selectively applied to the substrate at different illumination energies that are determined in accordance with required semiconductor characteristics.

In the present invention, it is preferred that laser light illumination be effected with a linear beam that is produced by converting spot-like laser light. In this case, since it suffices to perform one-dimensional beam scanning, the processing time can be shortened and processing for a large area is made possible. Where a sample area is small or a large-area beam pattern can be obtained, spot-like laser light may be used.

The reason why laser light illumination is performed in two steps is to minimize the degradation in uniformity of a film surface due to laser light illumination. The reason why the preliminary illumination is effective in maintaining the film uniformity is that a crystalline film produced by the above-described methods includes many amorphous portions and therefore has a laser energy absorption ratio that is much different than a polycrystalline film. The two-step illumination acts such that amorphous portions remaining in a film are crystallized in the first illumination and crystallization is accelerated over the entire film in the second illumination. Having remarkable effects, the two-step illumination can greatly improve the characteristics of a completed semiconductor device. To improve the uniformity, it is preferred that the second beam illumination be performed approximately perpendicularly to the substrate.

During the laser light illumination, it is necessary to keep the substrate temperature at several hundred degrees centigrade (100° to 600° C.), to reduce the rate of increase and decrease of the temperature of the illumination surface caused by the laser light illumination. It is generally known that an abrupt variation in an environment impairs uniformity of matter. By keeping the substrate temperature high, the uniformity of the substrate surface can be maintained against the laser light illumination. No specific atmosphere control is performed during the laser light illumination; that is, the laser light illumination may be performed in the air.

A brief description will be made of an example of a process that exploits the present invention. First, an amorphous silicon film is deposited over the entire surface of a glass substrate. Then, to add Ni partially, a $SiO_2$ film (thickness: more than 300 Å) is deposited on the amorphous silicon film, and part of the $SiO_2$ film in an area (peripheral circuit area) where Ni is to be introduced is removed by patterning, to expose part of the amorphous silicon in that area. Then, a nickel acetate salt solution is applied to the entire surface. As a result, Ni is introduced into the surface of the exposed amorphous silicon film. Subsequently, a heat treatment is performed at 550° C. for 4 hours. In a silicon film thus produced, only the Ni-added portion is crystallized. This is because the part of the amorphous film not added with Ni is not crystallized under the conditions of 550° C. and 4 hours.

In this state, both of the Ni-added portion (crystallized; peripheral circuit area) and the portion not added with Ni (remaining amorphous; pixel area) are illuminated with laser light at predetermined illumination energy densities, respectively. To this end, the laser light illumination conditions for the respective portions need to be properly adapted. In the invention, mask A is used to illuminate only the pixel area, mask B is used to illuminate only the peripheral circuit area, and laser light is applied in two steps.

In the first illumination, the pixel area and the peripheral area are illuminated at the same energy without using a mask. The illumination energy density is set at such a value as to positively effect crystallization of the pixel area. Whether the pixel area has been crystallized can be judged from a change of its color.

In the second illumination, the pixel area and the peripheral circuit area are illuminated at different energies by using a mask. The illumination energy for the peripheral circuit area is set at 140% to 190% of that in the first illumination. The illumination energy for the pixel area is set 5% to 30% higher than that for the peripheral circuit area in the second illumination.

With the second laser light illumination, the crystallinity of the Ni-added and crystallized area is enhanced. On the other hand, the area that was not added with Ni and is left amorphous is now crystallized.

As a result, two kinds of crystalline silicon films having different crystallization processes are obtained: the crystalline silicon film that was added with Ni, firstly crystallized by heating, and secondly crystallized by laser light illumination, and the crystalline silicon film that was not added with Ni, and crystallized only by laser light illumination. Because of the differences in crystallization process, the two kinds of crystalline silicon films have much different film qualities, which can be measured as differences of characteristics of thin-film transistors that are produced by using those crystalline silicon films.

Thin-film transistors produced by using the Ni-added area have large off-currents that vary by two or more orders from one transistor to another, but have a large average mobility of more than 100 $cm^2/Vs$. Therefore, these thin-film transistors are suitable for use in the peripheral circuits. On the other hand, thin-film transistors produced by using the area not added with Ni have a small mobility of less than 20 $cm^2/Vs$ but a small off-current variation (off-currents almost fall within the same order). Therefore, these thin-film transistors are suitable for use in the pixel area.

By employing the laser processing method of the present invention, thin-film transistors whose characteristics are most suitable for use in the pixel area and thin-film transistors whose characteristics are most suitable for use in the peripheral circuits can be formed on the same substrate.

In the present invention, the metal element for accelerating crystallization of silicon may be, in addition to Ni, one or a plurality of metals selected from Fe, Co, Ru, Rh, Pd, Os, Ir, Pt, Cu and Au.

To introduce a metal element other than Ni, the following compounds (solutions) may be used.

For example, where Fe (iron) is used as the metal element for accelerating crystallization of silicon, there may be used an iron compound, i.e., an iron salt selected from, for instance, ferrous bromide ($FeBr_2 6H_2O$), ferric bromide ($FeBr_3 6H_2O$), ferric acetate ($Fe(C_2H_3O_2)_3 xH_2O$), ferrous chloride ($FeCl_2 4H_2O$), ferric chloride ($FeCl_3 6H_2O$), ferric fluoride ($FeF_3 3H_2O$), ferric nitrate ($Fe(NO_3)_3 9H_2O$), ferrous phosphate ($Fe_3(PO_4)_2 8H_2O$), and ferric phosphate ($FePO_4 2H_2O$).

Where Co (cobalt) is used, there may be used its compound, i.e., a cobalt salt selected from, for instance, cobalt bromide ($CoBr 6H_2O$), cobalt acetate ($Co(C_2H_3O_2)_2 4H_2O$), cobalt chloride ($COCl_2 6H_2O$), cobalt fluoride ($CoF_2 xH_2O$), and cobalt nitrate ($Co(NO_3)_2 6H_2O$).

Where Ru (ruthenium) is used, there may be used its compound, i.e., a ruthenium salt of ruthenium chloride ($RuCl_3 H_2O$), for instance.

Where Rh (rhodium) is used, there may be used its compound, i.e., a rhodium salt of rhodium chloride ($RhCl_3 3H_2O$), for instance.

Where Pd (palladium) is used, there may used its compound, i.e., a palladium salt of palladium chloride ($PdCl_2 2H_2O$), for instance.

Where Os (osmium) is used, there may used its compound, i.e., an osmium salt of osmium chloride ($OsCl_3$), for instance.

Where Ir (iridium) is used, there may used its compound, i.e., an iridium salt selected from, for instance, iridium trichloride ($IrCl_3 3H_2O$) and iridium tetrachloride ($IrCl_4$).

Where Pt (platinum) is used, there may be used its compound, i.e., a platinum salt of platinic chloride ($PtCl_4 5H_2O$), for instance.

Where Cu (copper) is used, there may be used its compound, i.e., a copper salt selected from cupric acetate ($Cu(CH_3COO)_2$), cupric chloride ($CuCl_2 2H_2O$), and cupric nitrate ($Cu(NO_3)_2 3H_2O$).

Where Au (gold) is used, there may be used its compound selected from gold trichloride ($AuCl_3 xH_2O$), a gold chloride salt ($AuHCl_4 4H_2O$), and tetrachloro gold sodium ($AuNaCl_4 2H_2O$).

Alternatively, plural ones of the above compounds may be used as a mixture.

DESCRIPTION OF THE PREFERRED EMBODIMENTS

It has been described above that when laser light is applied to a film to which Ni is partially added in a process of improving the crystallinity of an amorphous or crystalline silicon film or a silicon compound film by illuminating it with laser light, the laser energy needs to be changed for the Ni-added portion and the other portion. In actual practice, as described in the summary of the present invention, since an $SiO_2$ film (silicon dioxide film; in the embodiments, 500 Å in thickness) as a mask is deposited on a portion that is not added with Ni, various combinations of steps may be conceived such as a method in which laser light is applied after removal of the $SiO_2$ film, and a method in which laser light is applied before removal of the $SiO_2$ film.

In the following embodiments, various manufacturing methods of a semiconductor material suitable for a liquid crystal display device will be proposed and discussed in which the order and methods of the removal of an $SiO_2$ film and the laser light illumination are changed.

Embodiment 1

Figure 1:
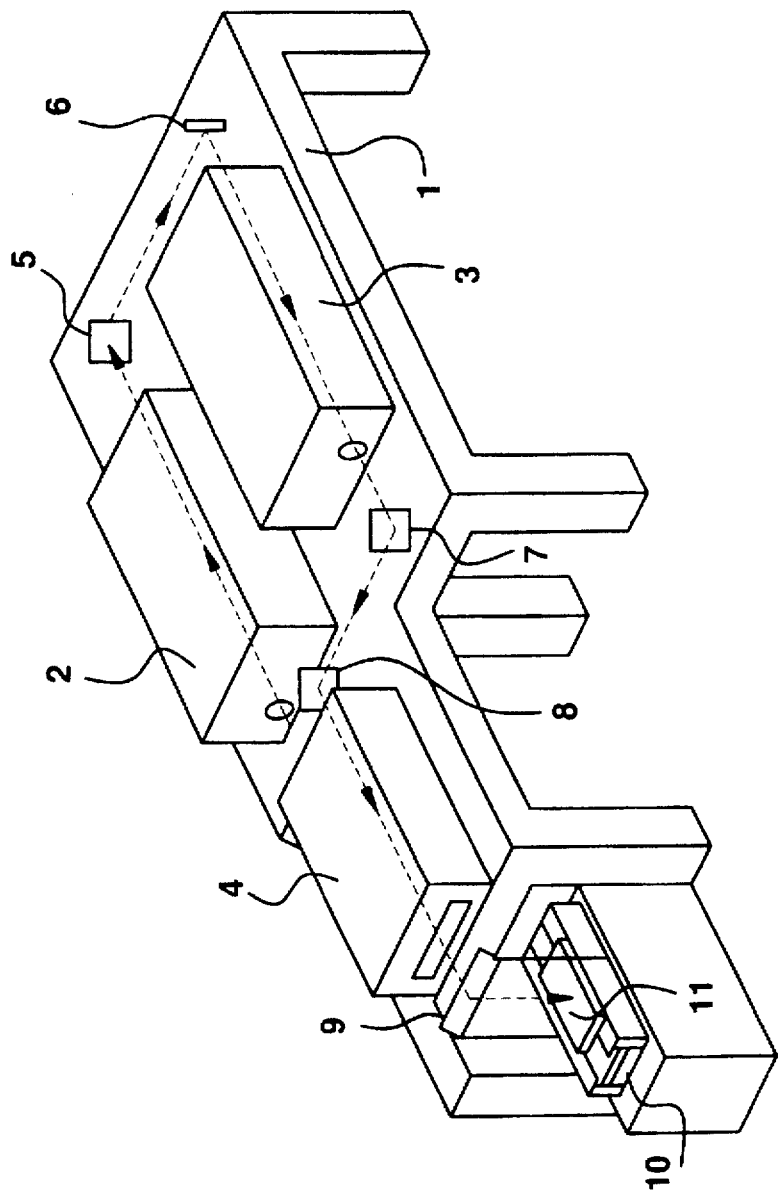
FIG. 1 shows the configuration of a laser light illumination apparatus used in the first embodiment of the present invention.

FIG. 1 shows the configuration of a laser annealing apparatus used in this embodiment. An oscillator 2 for emitting laser light is provided on a base 1. Full-reflection mirrors 5 and 6 are arranged on an optical path on the light emission side of the oscillator 2. An amplifier 3, full-reflection mirrors 7 and 8, an optics 4, and a full-reflection mirror 9 are arranged in this order on an optical path on the reflection side of the full-reflection mirror 6. A stage 10 on which a sample 11 is mounted is disposed on an optical path extending downward from the full-reflection mirror 9.

Controlled by a computer, the stage 10 can reciprocate one-dimensionally and rotate in its own plane. Further, incorporating a heater, the stage 10 can keep the sample 11 at a prescribed temperature.

Figure 2:
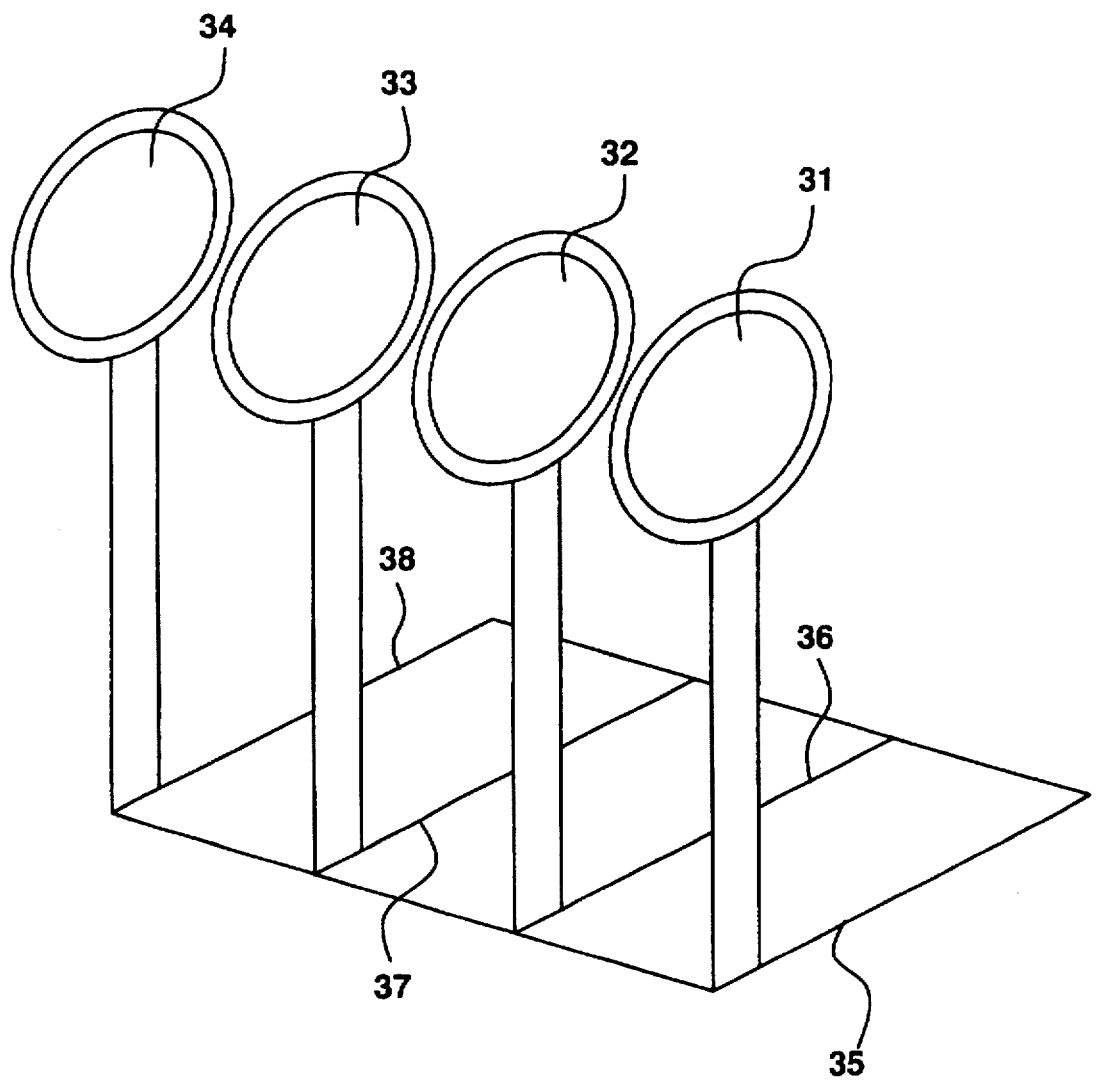
FIG. 2 shows the structure of light attenuation filters.

Although not shown in FIG. 1, light attenuation filters are detachably disposed between the full-reflection mirror 8 and the optics 4. FIG. 2 shows the structure of a driving mechanism of the light attenuation filters. Light attenuation filters 31 to 34 can be moved along respective rails 35 to 38 by remote control; that is, they can be inserted into and removed from the optical path by the straight movement. The light attenuation filters 31 to 34 have different transmittances, and 15 kinds of attenuation factors can be obtained by combining the filters 31 to 34. In this embodiment, the transmittances of the light attenuation filters are set at 96%, 92%, 85% and 77%, respectively. A transmittance range of 57 to 96% can substantially be covered by combining the light attenuation filters 31 to 34. For example, a light attenuation filter having a transmittance 88% can be obtained by combining the light attenuation filter 31 (96%) and the light attenuation filter 32 (92%).

Laser light emitted from the oscillator 2 is KrF excimer laser light (wavelength: 248 nm; pulse width: 25 ns). It goes without saying that other excimer lasers and other types of lasers may also be used.

Laser light emitted from the oscillator 2 are reflected by the full-reflection mirrors 5 and 6, amplified by the amplifier 3, reflected by the full-reflection mirrors 7 and 8, and input to the optics 4.

Figure 3:
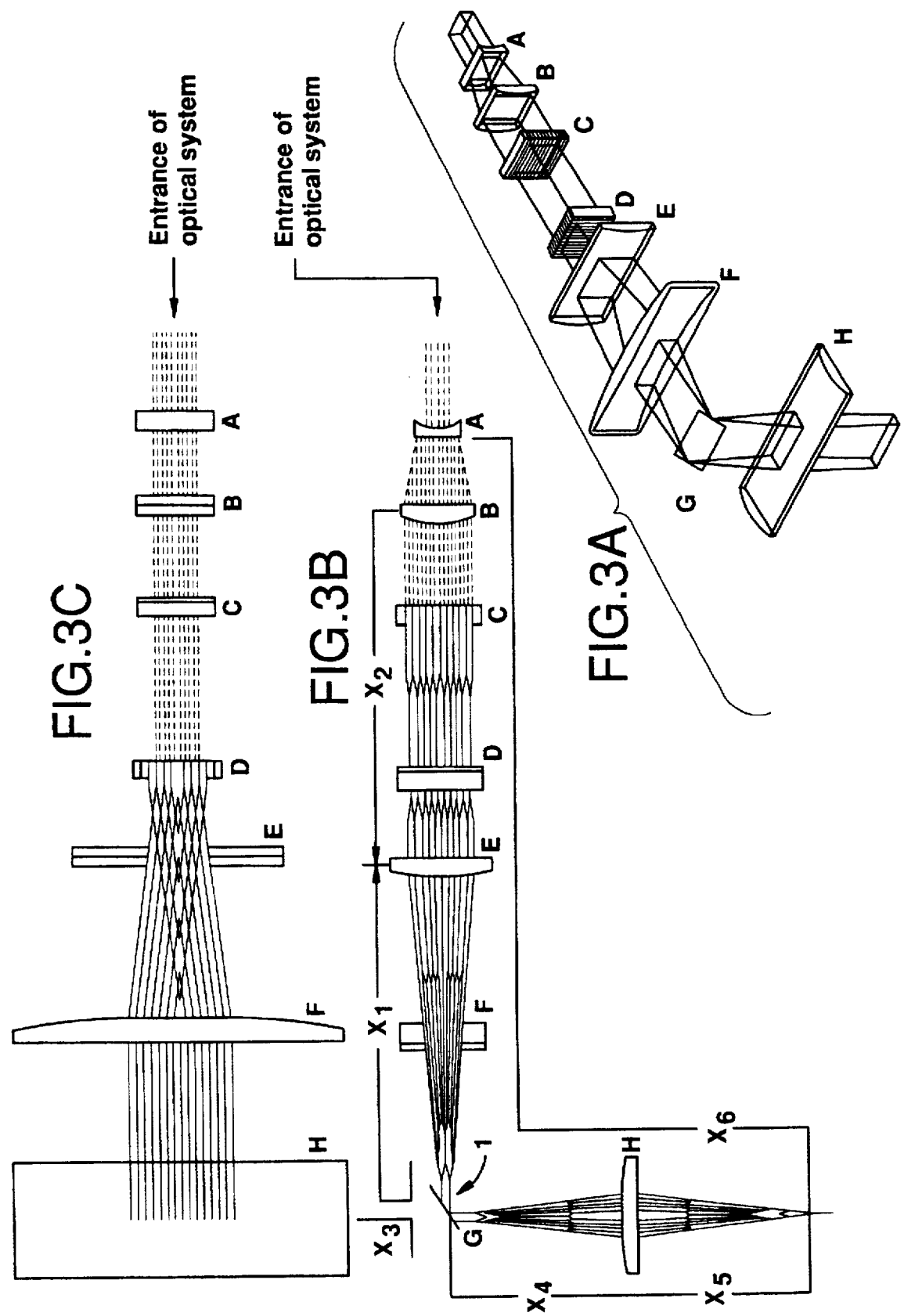
FIGS. 3A, 3B and 3C show the configuration of an optics.

FIGS. 3A, 3B and 3C show an optical configuration, i.e., inside structure of the optics 4. Laser light entering the optics 4 passes through a cylindrical concave lens A, a cylindrical convex lens B, and fly-eye lenses C and D. As a result, the original laser light having a Gaussian profile is converted into light having a rectangular profile. Further, the laser light passes through cylindrical convex lenses E and F, reflected by a mirror G (corresponds to the mirror 9 in FIG. 1), and converged by a cylindrical lens H. Thus, the laser light is shaped into a linear beam and applied to the sample 11.

A laser beam immediately before entering the optics 4, which assumes a rectangle of about 3×2 cm², is converted by the optics 4 into a long and narrow linear beam having a length of 10 to 30 cm and a width of 0.1 to 1 cm. Laser light as output from the optics 4 has a maximum energy of 1,000 mJ/shot.

The reason for converting the original laser light into the long and narrow beam is to improve its processing ability. After being output from the optics 4, the linear beam is reflected by the full-reflection mirror 9, and applied to the sample 11. Since the laser beam is longer than the width of the sample 11, it can be applied to the entire sample 11 by moving the sample 11 in one direction. Therefore, the driving device of the stage 10 can be simplified in structure, and can be maintained more easily. Further, the alignment of the sample 11 can be taken more easily when it is fixed to the stage 10.

Figure 4:
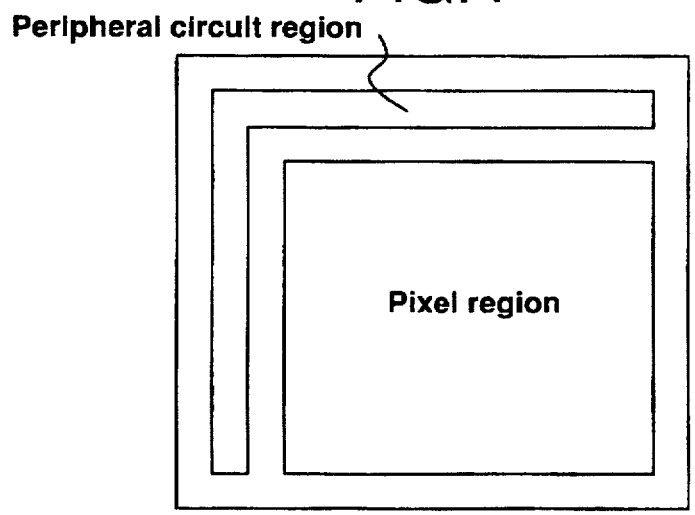
FIG. 4 is a top view of an active matrix liquid crystal display device.
Figure 5:
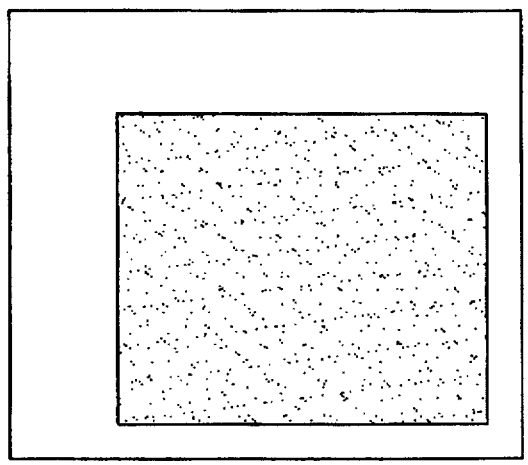
FIGS. 5 and 6 are top views of masks that are used when laser light illumination is performed.
Figure 6:
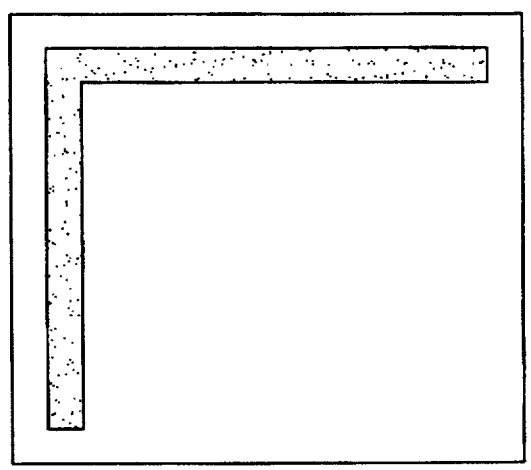

FIG. 4 is a top view of a substrate of an active matrix liquid crystal display device. A rectangular pixel area for displaying a video image and an L-shaped peripheral circuit area for driving pixels are provided on the substrate. FIGS. 5 and 6 are top view of masks that are used to partially illuminate the substrate with laser light. FIG. 5 shows mask A for pixel area illumination, and FIG. 6 shows mask B for peripheral circuit area illumination. In masks A and B, a black portion transmits light.

A description will be made of an example of forming crystalline silicon films on a glass substrate by laser light illumination by exploiting the present invention. First, a glass substrate (e.g., Corning 7059 or Corning 1737) of 10 cm×10 cm is prepared. A 2,000-Å-thick silicon oxide film is formed on the glass substrate by plasma CVD using TEOS as a material. This silicon oxide film serves as an undercoat film for preventing impurities from diffusing from the glass substrate into a semiconductor film.

Subsequently, an amorphous silicon film is deposited by plasma CVD. Alternatively, low-pressure thermal CVD may be used. The thickness of the amorphous silicon film is set at 500 Å. Naturally, the thickness of the amorphous silicon film is not limited to this value, but may be set as required. Then, a 500-Å-thick $SiO_2$ film (silicon dioxide film) is deposited by sputtering, which film will serve as a mask in a subsequent Ni-adding step. Therefore, it should be thicker than 300 Å.

Thereafter, the part of the $SiO_2$ film in the peripheral circuit area (see FIG. 4) is removed by patterning to expose the part of the amorphous silicon film in the peripheral circuit area. Then, the substrate is immersed in ammonia hydrated of 70° C. and left therein for 5 minutes, so that a $SiO_2$ film of 50 to 80 Å in thickness is formed on the exposed portion of the amorphous silicon film. The reason for forming the thin $SiO_2$ is to improve the wettability to a solution; that is, if a solution were directly applied to the amorphous silicon film, it would be repelled.

To introduce Ni for accelerating crystallization of the amorphous silicon film into the amorphous silicon film in the peripheral circuit area, a liquid-phase nickel acetate salt is applied to the substrate surface by spin coating. In this operation, Ni is not introduced into the amorphous silicon film in the pixel area because its surface is covered with the 500-Å-thick $SiO_2$ film. On the other hand, since the $SiO_2$ film formed in the peripheral circuit area is thinner than 100 Å, it does not serve as a mask. That is, Ni is allowed to penetrate the $SiO_2$ film and diffuse into the amorphous silicon film in the peripheral circuit area.

The above step needs to be so adapted that Ni is introduced into the amorphous silicon film within a concentration range of $1\times10^{16}$ to $5\times10^{19}$ atoms/cm³. The reasons are as follows. If the concentration is lower than $1\times10^{16}$ atoms/cm³, the function of accelerating the crystallization is not obtained. If the concentration is higher than $5\times10^{19}$ atoms/cm³, a resulting silicon film will contain many nickel silicide components, whereby the semiconductor characteristics will be impaired. In practice, the Ni concentration of the nickel acetate salt solution is so adjusted as to obtain a concentration within the above range.

Subsequently, to remove hydrogen from the amorphous silicon film, the substrate is left in a nitrogen atmosphere of 450° C. for 1 hour. This is to reduce the threshold energy in a subsequent crystallization step by intentionally forming dangling bonds in the amorphous silicon film.

Then, a heat treatment of 550° C. is performed for 4 hours in a nitrogen atmosphere. With this heat treatment, the amorphous silicon film not added with Ni in the pixel area is not crystallized while the Ni-added amorphous silicon film in the peripheral circuit area is crystallized. The low crystallization temperature of 550° C. is due to the action of Ni.

Thus, a silicon film selectively having crystallinity is formed on the glass substrate. Then, KrF excimer laser light (wavelength: 248 nm; pulse width: 25 ns) is applied to the entire surface of the silicon film by using the apparatus shown in FIG. 1.

The laser beam is shaped into a rectangular form by using the beam shape conversion optics to obtain an illumination beam area of 125 mm×1 mm. The sample 11 is mounted on the stage 10. The laser light is applied to the entire surface of the sample 11 while the stage 10 is moved at 2 mm/s.

As for the laser light illumination conditions, the two-step illumination is employed in which the preliminary illumination is performed at 150 to 250 mJ/cm$^2$ and the main illumination is performed at 200 to 380 mJ/cm$^2$, and the pulse rate is set at 30 pulses/s. The reason for employing the two-step illumination is to minimize the deterioration in uniformity of the film surface due to the laser light illumination, to thereby form a film of better crystallinity.

To change the energy from the preliminary illumination to the main illumination, proper ones of the light attenuation filters 31 to 34 (see FIG. 2) are inserted into the optical path. This is more convenient than changing the illumination energy density by changing the output energy of the laser illumination apparatus.

To reduce the speed of increase and decrease of the temperature of the substrate surface due to the illumination, the substrate temperature is kept at 500° C. during the laser light illumination. It is necessary that the heating temperature during the laser light illumination be within a range of 450° to 700° C., preferably 500° to 600° C. In particular, when a glass substrate is used, it is important that the upper limit of the heating temperature be set at about 600° C. No atmosphere control is performed; that is, the illumination is performed in the air.

After the above laser light illumination, the SiO$_2$ film is removed and another laser light illumination is performed. To remove the SiO$_2$ film, BHF (buffer hydrofluoric acid) is used. The 500-Å-thick SiO$_2$ film for preventing introduction of Ni into the amorphous silicon film is formed on the amorphous silicon film in the pixel area. On the other hand, the thin (50 to 80 Å) SiO$_2$ film is formed on the Ni-added silicon film in the peripheral circuit area. Thus, the SiO$_2$ film deposited in the peripheral circuit area and that deposited in the other area have different thicknesses. Some contrivance is needed to remove such SiO$_2$ films. In general, a SiO$_2$ film is etched with BHF at a higher rate than a crystalline silicon film. In this embodiment, the SiO$_2$ films are removed by utilizing this feature.

First, the substrate is immersed in BHF for 5 seconds, and then cleaned with water quickly. The very thin SiO$_2$ film on the Ni-added portion is removed almost completely in 5 seconds, so that the surface of the silicon film in the peripheral circuit area is exposed. After the substrate is dried sufficiently, laser light is applied to the peripheral circuit area by using mask B shown in FIG. 6.

As in the previous laser light illumination, this laser light illumination is performed in two steps: preliminary illumination and main illumination. With this laser light illumination, a silicon film of better crystallinity can be formed in the peripheral circuit area.

Thereafter, the substrate is immersed in BHF for 40 seconds, and then cleaned with water quickly and dried sufficiently. The 500-Å-thick SiO$_2$ on the silicon film in the pixel area can be removed almost completely in 40 seconds. The silicon film in the peripheral circuit area has been converted to a polycrystalline silicon film by the previous laser illumination, the silicon film is hardly etched due to a difference in etching rate between SiO$_2$ and polycrystalline silicon.

If the etching with BHF were performed for 40 seconds without applying laser light to the Ni-added portion in advance (i.e., without accelerating crystallization by laser light illumination), the Ni-added crystalline silicon film would be damaged considerably. This is because the BHF resistance of this film is very low (probably resulting from the existence of Ni). To avoid this problem, the Ni-added portion is polycrystallized in advance by illuminating it with laser light.

Figure 10:
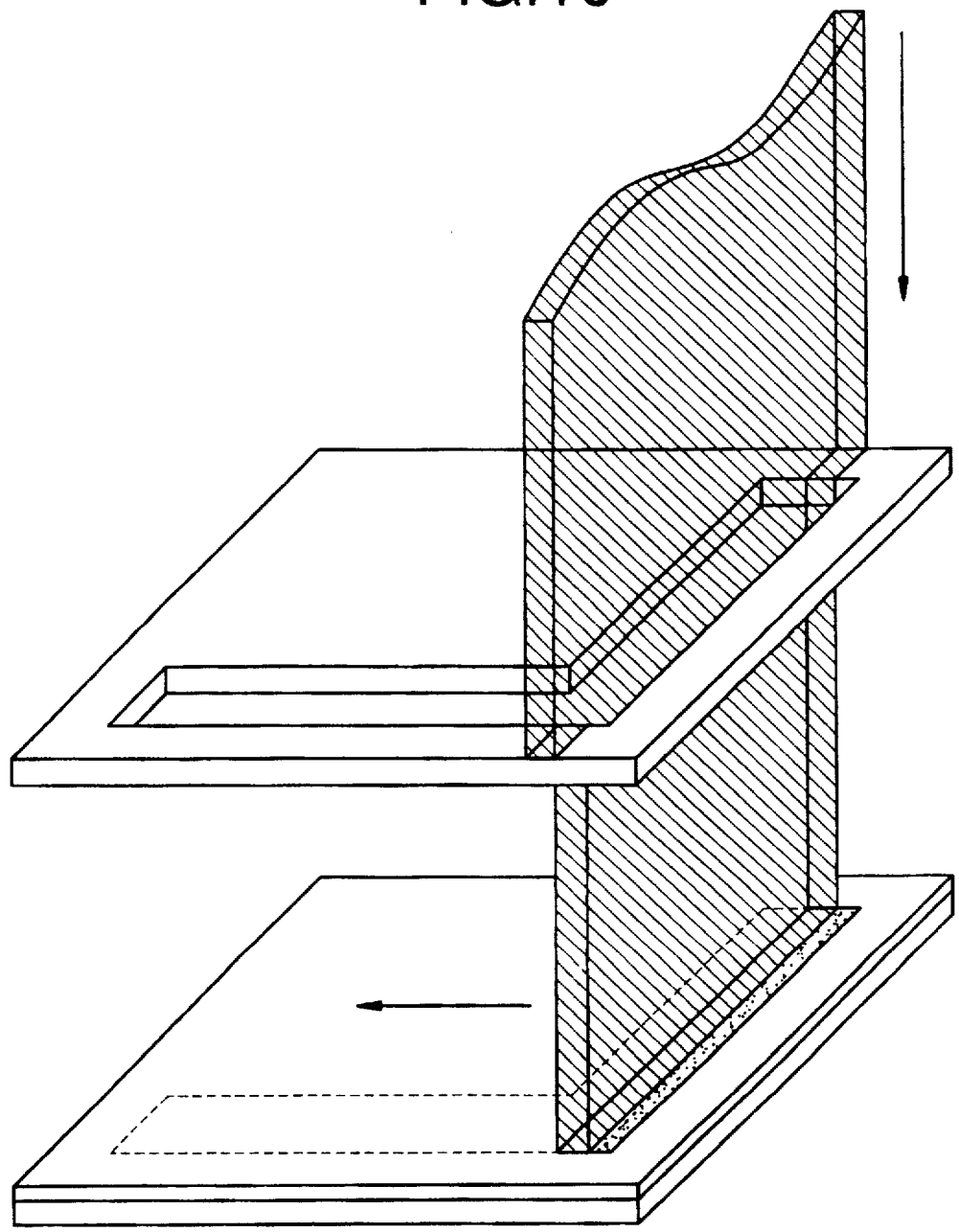
FIG. 10 schematically illustrates laser light illumination using a mask.

Finally, the pixel area is illuminated in two steps by using mask A shown in FIG. 5. As shown in FIG. 10, by using mask B, laser light is applied in accordance with the mask pattern. As a result, a crystalline silicon film is formed in the pixel area.

With the process of this embodiment, a predetermined region on a glass substrate can be given a required degree of crystallinity. Thin-film transistors in the peripheral circuit area having a large mobility and those in the pixel area having a superior off-current characteristic can be formed at the same time on the same substrate.

Embodiment 2

First, as in the first embodiment, an amorphous silicon film is formed and a SiO$_2$ film is formed thereon. The part of the SiO$_2$ film in the peripheral circuit area is removed, and Ni is introduced into the amorphous silicon film in the peripheral circuit area. The silicon film in the peripheral circuit area is crystallized by a heat treatment.

Subsequently, in this embodiment, laser light illumination is performed without removing a very thin SiO$_2$ film formed in the peripheral circuit area.

Laser light is applied only to the peripheral circuit area by using mask B. At this time, only the preliminary illumination is performed. Then, after the SiO$_2$ film in the peripheral circuit area is etched, the main illumination is performed.

In the preliminary illumination, since laser light is applied through the oxide film, it is feared that the boundary surface between the oxide film and the amorphous silicon film may be disordered. However, since the oxide film is very thin, no such disorder occurs as influences the characteristics of the oxide film. After the preliminary illumination, the substrate is immersed in BHF for 40 seconds to etch the SiO$_2$ film. In this operation, since the Ni-added portion has been subjected to only the preliminary illumination, it is feared that the laser light resistance of the surface may be reduced by the etching. However, there occurs no problem because the Ni-added portion is sufficiently crystallized only by the preliminary illumination.

After completion of the etching, the main illumination is performed on the Ni-added portion by using mask B. Then, laser light is applied, in two steps, to the pixel area by using mask A.

Embodiment 3

The process of this embodiment is a little different than the second embodiment in the method of illuminating the Ni-added portion. In this embodiment, the preliminary illumination and the main illumination of laser light are performed on the Ni-added silicon film in the peripheral circuit area by using mask B without etching the SiO$_2$ film. Thereafter, the SiO$_2$ is completely removed by etching, and laser light is applied, in two steps, to the pixel area by using mask A.

Embodiment 4

In this embodiment, an example of a laser light illumination apparatus will be described, which can be used for the semiconductor manufacturing processes of the first to third embodiments.

Figure 7:
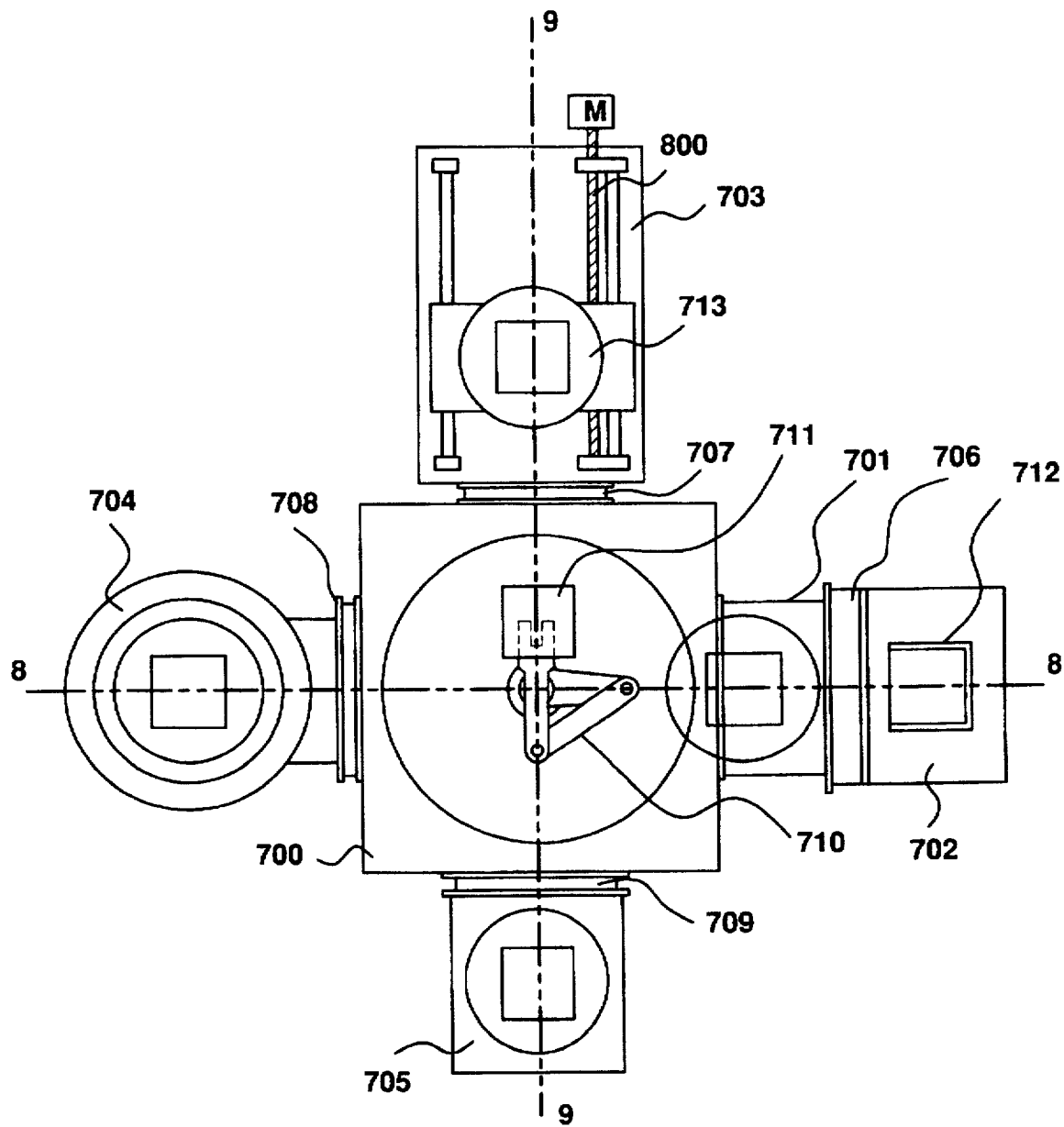
FIG. 7 is a top view of a laser light illumination apparatus used in the second embodiment of the invention.
Figure 8:
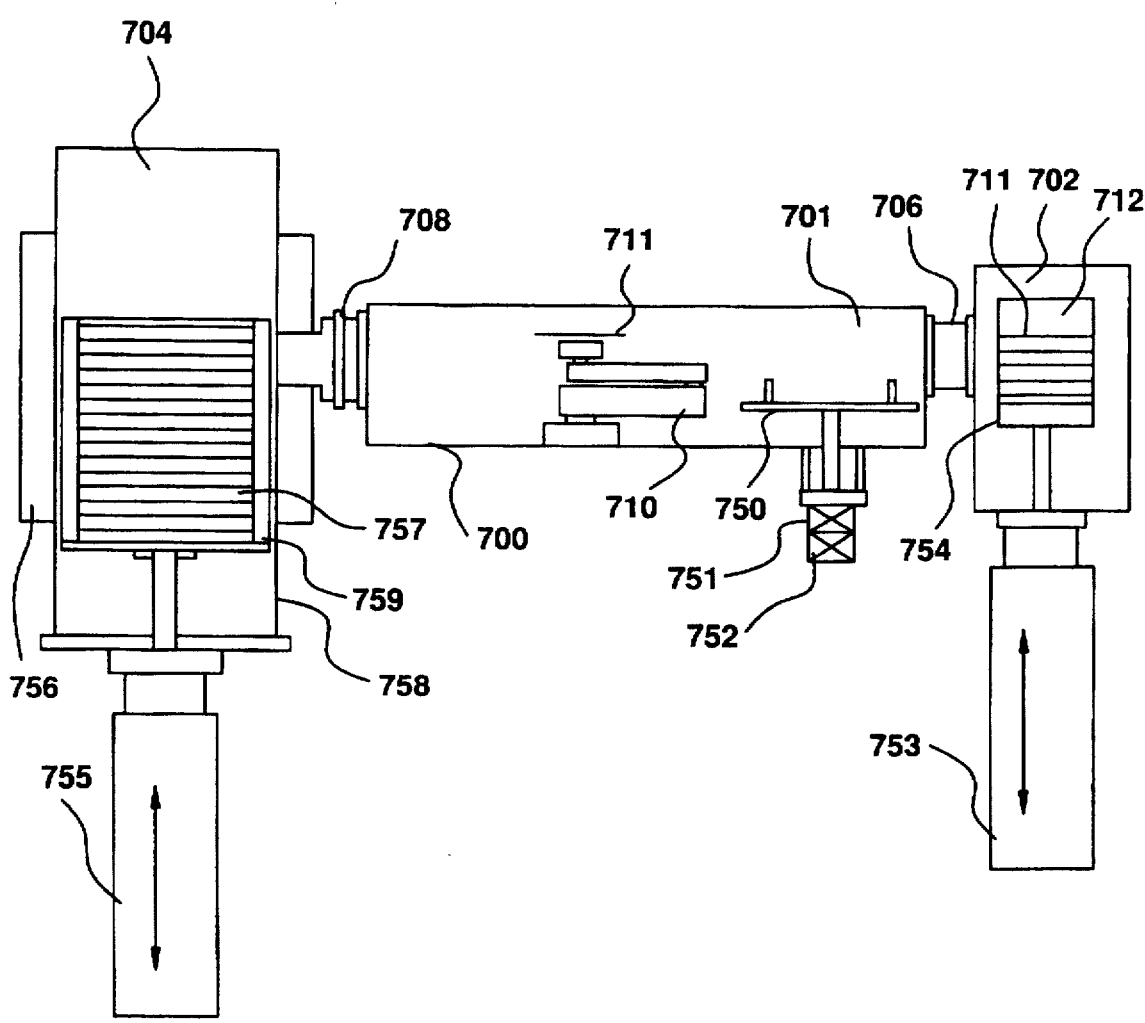
FIG. 8 is a sectional view taken along line A—A' in FIG. 7.
Figure 9:
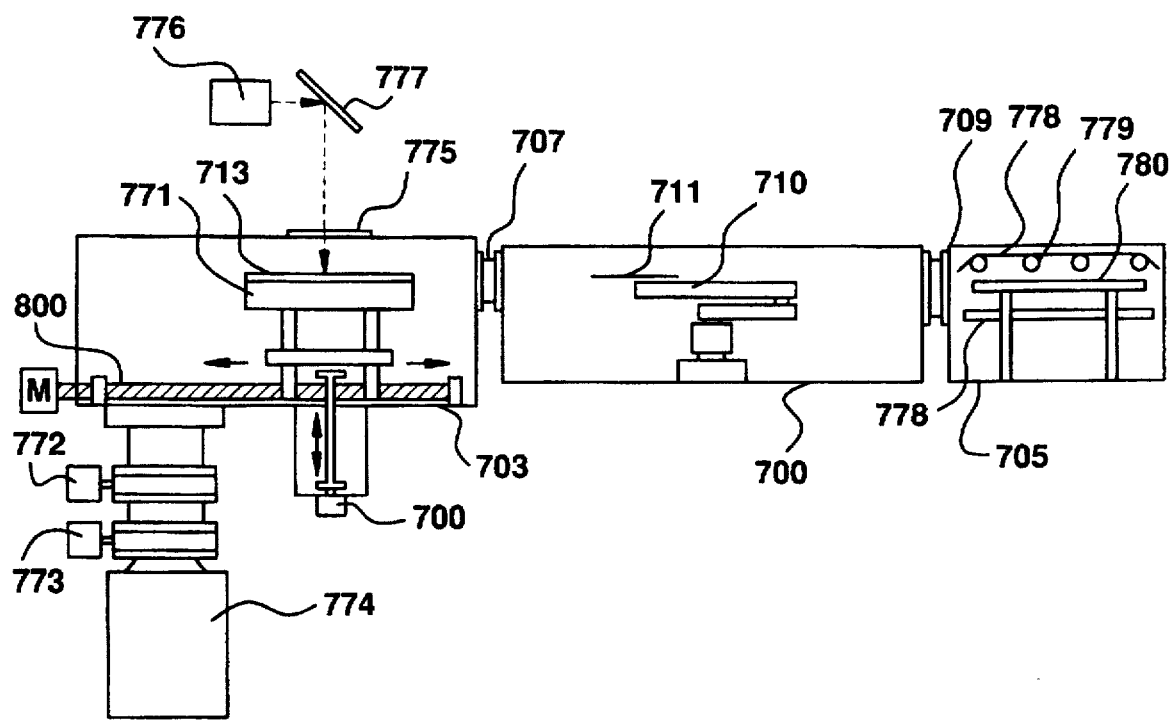
FIG. 9 is a sectional view taken along line B—B' in FIG. 7.

FIG. 7 is a top view schematically showing a laser illumination apparatus of this embodiment. FIG. 8 is a sectional view taken along line A—A' in FIG. 7, and FIG. 9 is a sectional view taken along line B—B' in FIG. 7.

This laser illumination apparatus has a substrate input/output chamber 702 in which a cassette 712 for accommodating a plurality of substrates 711 (samples to be illuminated with laser light) is disposed. Disposed over an elevator stage 754, the cassette 712 can be finely moved in the vertical direction by an elevator 753. The substrates 711 are carried from the exterior into the substrate input/output chamber 702 together with the cassette 712.

The substrates accommodated in the cassette 712 are first moved, one by one, to an alignment chamber 701 by a robot arm 710. The alignment chamber 701 is connected to the substrate input/output chamber 702 through a gate valve 706. An alignment mechanism 750 is disposed in the alignment chamber 701. The alignment mechanism 750 is finely moved in the vertical direction by an elevator 752, and has a function of adjusting the positional relationship between the substrate 711 and the robot arm 710 by means of an operating mechanism 751.

After the positional relationship between the robot arm 710 and the substrate 711 is adjusted by the alignment mechanism 750, the substrate is transferred to a heating chamber 704, which is connected to a substrate transport chamber 700 through a gate valve 708. The heating chamber 704 serves to preliminarily increase the temperature of the substrates (samples) to be illuminated with laser light by heating those. The reason for heating the substrates is to make the laser light illumination more effective.

The heating chamber 704 is constituted of a quartz cylinder 758, and has a substrate holder 759 made of quartz. Provided with a susceptor 757, the substrate holder 759 can accommodate a large number of substrates. The substrate holder 759 is finely moved in the vertical direction by an elevator 755. The heating of the substrates in the heating chamber 704 is performed by a heater 756.

The substrate that has been heated for a predetermined time in the heating chamber 704 is moved into the substrate transport chamber 700 by the robot arm 710, and again subjected to positioning by the alignment mechanism 750.

The substrate preheated in the heating chamber 704 is transferred to a laser light illumination chamber 703 by the robot arm 710. The laser light illumination chamber 703 is connected to the substrate transport chamber 700 through a gate valve 707. In the laser light illumination chamber 703, laser light emitted from a laser oscillator 776 is reflected by a mirror 777 and applied to a substrate 713 through a window 775 made of quartz. The laser light has a linear pattern as described above.

Placed on a substrate stage 771, the substrate 713 is heated to a predetermined temperature (450° to 700° C.) by a heater incorporated in the substrate stage 771 and kept at that temperature. The substrate stage 771 can be finely moved in the vertical direction by an elevator 770, and can be moved in one direction by a moving mechanism 800. The reason for finely moving the substrate stage 771 in the vertical direction is to change the focal point of laser light when necessary. The reason for moving the substrate stage 771 in one direction is to apply linear laser light to the sample while scanning it. Although not shown in the figures, during the laser light illumination, the masks as shown in FIGS. 5 and 6 are placed on the sample when necessary.

The laser light illumination chamber 703 is connected to a vacuum exhaust pump 774 through valves 772 and 773, its inside can be rendered in a low-pressure state or a vacuum state when necessary.

After completion of the laser light illumination, the substrate is moved into the substrate transport chamber 700 by the robot arm 710, and transferred to a slow cooling chamber 705. In this operation, positioning between the substrate and the robot arm 710 is again performed by the alignment mechanism 750.

The slow cooling chamber 705 is connected to the substrate transport chamber 700 through a gate valve 709. The substrate placed on a quartz stage 780 is slowly cooled while being illuminated with infrared light coming from lamps 779 and a reflector 778.

The substrate slowly cooled in the slow cooling chamber 705 is transferred to the substrate transport chamber 700 by the robot arm 710, and re-accommodated in the substrate holder 712. Thus, the laser light illumination process for one substrate is completed. To perform laser light illumination on a plurality of substrates, the above process may be performed consecutively.

With the laser processing method of the present invention, the characteristics of a film in which semiconductor devices are to be formed can be changed selectively. The present invention can be applied to all the laser processing processes that are used in processes of forming semiconductor devices. In particular, where semiconductor devices are ones used in a TFT liquid crystal panel, the present invention is useful in forming devices having a mobility larger than 100 $cm^2/Vs$ and therefore being suitable for use in the peripheral circuits, and devices that have uniform characteristics among the devices and particularly have a small off-current variation and that are therefore suitable for use in the pixel area. This results in an advantage that appears as high-speed image movement in a TFT liquid crystal display device manufactured by a low-temperature process and reduction of a rate of occurrence of defective substrates having a point defect, a line defect, or the like. Thus, the present invention is very useful from the industrial point of view.

What is claimed is:

1. A laser processing method of a semiconductor device having an amorphous silicon film formed on a substrate that is to finally constitute a liquid crystal display device, said method comprising:

the first step of depositing a silicon oxide film on the amorphous silicon film;

the second step of removing part of the silicon oxide film deposited in a peripheral circuit area by patterning the silicon oxide film;

the third step of introducing a metal element for accelerating crystallization of silicon into part of the amorphous silicon film in the peripheral circuit area, and performing a heat treatment;

the fourth step of crystallizing the part of the amorphous silicon film in the peripheral circuit area by illuminating laser light thereto;

the fifth step of removing all the remaining silicon oxide film by etching it;

the sixth step of illuminating a silicon film crystallized in the fourth step with laser light at an illumination energy that is 40% to 90% higher than that in the fourth step;

the seventh step of illuminating part of the amorphous silicon film in a pixel area with laser light at the same illumination energy as in the fourth step; and the eighth step of illuminating a silicon film that was illuminated in the seventh step with a laser light at an illumination energy that is 5% to 30% higher than that in the sixth step.

2. The method according to claim 1 wherein in the step of illuminating the silicon film in the pixel area or the peripheral circuit area, a laser light illumination region is restricted by using a mask.

3. A method for manufacturing an active matrix device comprising the steps of:

preparing a substrate having at least an active matrix region and a peripheral circuit region;

forming a semiconductor film over the substrate; said semiconductor film having at least a first portion over the active matrix region and a second portion over the peripheral circuit region;

disposing a first mask comprising silicon oxide on the first portion of the semiconductor film over the active matrix region while said second portion is exposed from said first mask;

oxidizing a surface of said second portion of the semiconductor film on the peripheral circuit region;

disposing a catalyst metal containing material on contact with the oxidized surface of the second portion over the peripheral circuit region, said catalyst metal being capable of promoting crystallization of the amorphous silicon;

heating said semiconductor film at such a temperature that said second portion of the semiconductor film is crystallized due to said catalyst metal while said first portion of the semiconductor film is not crystallized;

irradiating only the second portion of the semiconductor film over the peripheral circuit region with a laser light to further crystallize said second portion; and irradiating only the first portion of the semiconductor film over the active matrix circuit region with a laser light, wherein an irradiation energy of said light at said second portion is different from that at said first portion.

4. A method according to claim 3 wherein the irradiating step of said second portion with the laser light is carried out after etching a silicon oxide film formed on the second portion of the semiconductor film due to the oxidizing step.

5. A method according to claim 3 wherein the irradiating step of said second portion with the laser light comprises the steps of:

irradiating said second portion with a first laser light through a silicon oxide film formed on the second portion of the semiconductor film due to the oxidizing step;

removing said silicon oxide film after the irradiation of the first laser light; and irradiating said second portion with a second laser light.

6. A method according to claim 5 wherein said second laser light has a higher intensity than said first laser light.

* * * * *